US 8,384,568 B2

(12) United States Patent
Govindammagari et al.

(10) Patent No.: US 8,384,568 B2
(45) Date of Patent: Feb. 26, 2013

(54) DECODER CIRCUIT FOR DOWN-SAMPLING A DIFFERENTIAL MANCHESTER ENCODING

(75) Inventors: Sarvendra Govindammagari, Hyderabad (IN); Veerender Kumar Soma, Pargi (IN); Heramba Aligave, Hyderabad (IN); Douglas M. Grant, Gorebridge (GB)

(73) Assignee: Xilinx, Inc., San Jose, CA (US)

( * ) Notice: Subject to any disclaimer, the term of this patent is extended or adjusted under 35 U.S.C. 154(b) by 64 days.

(21) Appl. No.: 13/192,000

(22) Filed: Jul. 27, 2011

(65) Prior Publication Data

US 2013/0027228 A1 Jan. 31, 2013

(51) Int. Cl.
*H03M 5/12* (2006.01)

(52) U.S. Cl. ............ 341/70; 341/53; 375/282; 375/333

(58) Field of Classification Search .................... 341/53, 341/69, 70, 71; 375/282, 283, 333, 359, 375/360, 361
See application file for complete search history.

(56) References Cited

U.S. PATENT DOCUMENTS

| 4,462,051 | A | * | 7/1984 | Chan | 360/44 |
| 5,491,713 | A | * | 2/1996 | Kwok et al. | 375/333 |
| 6,933,866 | B1 | | 8/2005 | Weitz | |
| 7,310,390 | B2 | * | 12/2007 | Bertram | 375/340 |
| 7,382,845 | B1 | * | 6/2008 | Shenoi | 375/361 |
| 7,940,862 | B2 | * | 5/2011 | Tanaka et al. | 375/316 |
| 2005/0094756 | A1 | * | 5/2005 | Bertram | 375/360 |
| 2009/0322572 | A1 | * | 12/2009 | Mutchnik | 341/70 |
| 2011/0261969 | A1 | * | 10/2011 | Elkhatib et al. | 381/22 |

OTHER PUBLICATIONS

IBM Corp., *Differential Manchester Decoder Requiring Low Speed System Clock*, IBM Technical Disclosure Bulletin, Mar. 1989, pp. 100-103, vol. 31, No. 10, IBM Corp., Armonk, New York, USA.
Jiménez, J. et al., "Manchester Decoding Algorithm for Multifunction Vehicle Bus," *Proc. of the 2004 IEEE International Conference on Industrial Technology*, Dec. 8, 2009, pp. 789-774, vol. 2, IEEE, Piscataway, New Jersey, USA.

(Continued)

*Primary Examiner* — Howard Williams
(74) *Attorney, Agent, or Firm* — LeRoy D. Maunu

(57) ABSTRACT

Decoder circuits and methods down-sample the samples that oversample an input signal having a differential Manchester encoding. A first input port receives first, second, and third samples. A second input port receives a state indicating whether a clock transition or a data transition precedes the first, second, and third samples. A third input port receives first, second, and third down-sampled bits. A detector circuit is configured to generate a detection signal indicating a presence of a short pulse within the samples when the state indicates the clock transition and the second and third down-sampled bits are equal and differ from the first down-sampled bit and the third sample. A generator circuit is configured to generate a fourth down-sampled bit that equals the third sample when the detection signal indicates the presence of the short pulse, and that equals the second sample when the detection signal does not indicate the presence.

20 Claims, 6 Drawing Sheets

OTHER PUBLICATIONS

Tung, Shenchih et al., Physical Layer Design Automation for RFID Systems, *Proc. of the 2008 IEEE International Symposium on Parallel and Distributed Processing*, Apr. 14, 2008, pp. 1-8, IEEE, Piscataway, New Jersey, USA.

IEEE, *IEEE Standard for Information Technology—Telecommunications and information exchange between systems—Local and Metropolitan Area Networks—Specific Requirements* (Part 3: Carrier Sense Multiple Access with Collision Detection (CSMA/CD) Access Method and Physical Layer Specifications, Section 5, IEEE Std 802.3-2008, copyright 2008, pp. 1-615, IEEE, New York, New York, USA.

* cited by examiner

|             | 502    | 504 | 506 | 508 | 510 | 512   |
|-------------|--------|-----|-----|-----|-----|-------|
| Count name  | B3_reg | B0  | B1  | B2  | B3  | Value |
|             | 1      | 0   | 1   | 0   | 1   | 4     |
|             | 0      | 1   | 0   | 1   | 0   |       |
|             | 0      | 1   | 0   | 1   | 1   | 3     |
|             | 0      | 1   | 0   | 0   | 1   |       |
|             | 0      | 1   | 1   | 0   | 1   |       |
|             | 0      | 0   | 1   | 0   | 1   |       |
|             | 1      | 0   | 1   | 0   | 0   |       |
|             | 1      | 0   | 1   | 1   | 0   |       |
|             | 1      | 0   | 0   | 1   | 0   |       |
|             | 1      | 1   | 0   | 1   | 0   |       |
|             | 0      | 1   | 0   | 0   | 0   | 2     |
|             | 0      | 1   | 1   | 0   | 0   |       |
|             | 0      | 1   | 1   | 1   | 0   |       |
|             | 0      | 0   | 1   | 1   | 0   |       |
| Number of transitions | 0 | 0 | 1 | 0 | 0 |    |
|             | 0      | 0   | 0   | 1   | 0   |       |
|             | 1      | 0   | 1   | 1   | 1   |       |
|             | 1      | 0   | 0   | 1   | 1   |       |
|             | 1      | 0   | 0   | 0   | 1   |       |
|             | 1      | 1   | 0   | 0   | 1   |       |
|             | 1      | 1   | 0   | 1   | 1   |       |
|             | 1      | 1   | 1   | 0   | 1   |       |
|             | 0      | 1   | 1   | 1   | 1   | 1     |
|             | 0      | 0   | 1   | 1   | 1   |       |
|             | 0      | 0   | 0   | 1   | 1   |       |
|             | 0      | 0   | 0   | 0   | 1   |       |
|             | 1      | 0   | 0   | 0   | 0   |       |
|             | 1      | 1   | 0   | 0   | 0   |       |
|             | 1      | 1   | 1   | 0   | 0   |       |
|             | 1      | 1   | 1   | 1   | 0   |       |
|             | 1      | 1   | 1   | 1   | 1   | 0     |
|             | 0      | 0   | 0   | 0   | 0   |       |

514 — Number of transitions

FIG. 5-1

| Count name | B3_reg | B0 | B1 | B2 | B3 | Value |
|---|---|---|---|---|---|---|
| Number of unchanged bits | X | X | X | 1 | 0 | 1 |
| | X | X | X | 0 | 1 | |
| | X | X | 1 | 0 | 0 | 2 |
| | X | X | 0 | 1 | 1 | |
| | X | 1 | 0 | 0 | 0 | 3 |
| | X | 0 | 1 | 1 | 1 | |
| | 1 | 0 | 0 | 0 | 0 | 4 |
| | 0 | 1 | 1 | 1 | 1 | |
| | 0 | 0 | 0 | 0 | 0 | 5 |
| | 1 | 1 | 1 | 1 | 1 | |
| Number of unchanged bits before the last transition | X | X | 1 | 0 | 1 | 1 |
| | X | X | 0 | 1 | 0 | |
| | X | 1 | 0 | 1 | 1 | |
| | X | 0 | 1 | 0 | 0 | |
| | 1 | 0 | 1 | 1 | 1 | |
| | 0 | 1 | 0 | 0 | 0 | |
| | 0 | 1 | 1 | 1 | 1 | |
| | 1 | 0 | 0 | 0 | 0 | |
| | X | 1 | 0 | 0 | 1 | 2 |
| | X | 0 | 1 | 1 | 0 | |
| | 1 | 0 | 0 | 1 | 1 | |
| | 0 | 1 | 1 | 0 | 0 | |
| | 0 | 0 | 1 | 1 | 1 | |
| | 1 | 1 | 0 | 0 | 0 | |
| | 1 | 0 | 0 | 0 | 1 | 3 |
| | 0 | 1 | 1 | 1 | 0 | |
| | 0 | 0 | 0 | 1 | 1 | |
| | 1 | 1 | 1 | 0 | 0 | |
| | 0 | 0 | 0 | 0 | 1 | X |
| | 1 | 1 | 1 | 1 | 0 | |
| | 1 | 1 | 1 | 1 | 1 | X |
| | 0 | 0 | 0 | 0 | 0 | |

FIG. 5-2

| Count name | B3_reg | B0 | B1 | B2 | B3 | Value |
|---|---|---|---|---|---|---|
| Width of pulse 1 (520) | 0 | 1 | X | X | X | +0 |
| | 1 | 0 | X | X | X | +0 |
| | 0 | 0 | 1 | X | X | +1 |
| | 1 | 1 | 0 | X | X | +1 |
| | 0 | 0 | 0 | 1 | X | +2 |
| | 1 | 1 | 1 | 0 | X | +2 |
| | 1 | 1 | 1 | 1 | 1 | +3 |
| | 0 | 0 | 0 | 0 | 0 | +3 |
| Width of pulse 2 (522) | 0 | 1 | 0 | X | X | 1 |
| | 1 | 0 | 1 | X | X | 1 |
| | 0 | 1 | 1 | 0 | X | 2 |
| | 1 | 0 | 0 | 1 | X | 2 |
| | 0 | 0 | 1 | 1 | 0 | 2 |
| | 1 | 1 | 0 | 0 | 1 | 2 |
| | 0 | 1 | 1 | 1 | 0 | 3 |
| | 1 | 0 | 0 | 0 | 1 | 3 |
| Width of pulse 3 (524) | 0 | 1 | 0 | 0 | 1 | 2 |
| | 1 | 0 | 1 | 1 | 0 | 2 |
| | All other combinations ||||| 1 |

FIG. 5-3

500
DECODER CIRCUIT FOR DOWN-SAMPLING A DIFFERENTIAL MANCHESTER ENCODING

FIELD OF THE INVENTION

One or more embodiments generally relate to decoders, and more particularly to decoding an oversampling of a differential Manchester encoding.

BACKGROUND

A differential Manchester encoding alternates clock transitions with positions for data transitions. A bit value of one is encoded when a transition is present in a position for a data transition, and a bit value of zero is encoded when no transition occurs in a position for a data transition.

There is a general need for efficient and robust decoding of a differential Manchester encoding in the presence of noise and jitter, which affect the timing of the clock and data transitions.

SUMMARY

In one embodiment, a decoder circuit down-samples the samples that oversample an input signal having a differential Manchester encoding. A first input port is arranged to receive a first, a second, and a third sample of the samples. A second input port is arranged to receive a state indicating whether a clock transition or a data transition precedes the first, second, and third samples. A third input port is arranged to receive a first, a second, and a third down-sampled bit generated from the samples. A detector circuit is coupled to the first, second, and third input ports. The detector circuit is configured to generate a detection signal indicating a presence of a short pulse within the samples when the state indicates the clock transition and the second and third down-sampled bits are equal and differ from the first down-sampled bit and the third sample. A generator circuit is coupled to the detector circuit and the first input port. The generator circuit is configured to generate a fourth down-sampled bit. The fourth down-sampled bit equals the third sample when the detection signal indicates the presence of the short pulse, and the fourth down-sampled bit equals the second sample when the detection signal does not indicate the presence.

In one embodiment, a decoder circuit down-samples the samples from an input signal having a differential Manchester encoding. The decoder circuit includes a first, a second, a third, and a fourth instance of a down-sampling circuit, and each instance of the down-sampling circuit includes input and output ports, a detector circuit, and a generator circuit. The output port is arranged to transmit a respective down-sampled bit from its instance of the down-sampling circuit. The input port is arranged to receive a state, three of the samples, and three down-sampled bits from the respective down-sampled bit of the output port of the other instances of the down-sampling circuit. The three received samples include an initial, a middle, and a final sample. The detector circuit is coupled to the input port and is configured to generate a detection signal indicating a presence of a short pulse that ends before or within the three samples. The detection signal is generated from the state, the three samples, and the three down-sampled bits. The generator circuit is coupled to the detector circuit and the input and output ports. The generator circuit is configured to generate the respective down-sampled bit of its instance. This respective down-sampled bit equals the final sample when the detection signal indicates the presence of the short pulse, and this respective down-sampled bit equals the middle sample when the detection signal does not indicate the presence.

In one embodiment, a method down-samples the samples that oversample an input signal having a differential Manchester encoding. Three of the samples, a present state, and three down-sampled bits are input to a decoder circuit. The present state indicates whether a clock transition or a data transition precedes the three samples. The three samples include a first, a second, and a third sample. The three down-sampled bits are generated from the samples and include a first, a second, and a third down-sampled bit. A detection signal is generated that indicates a presence of a short pulse within the plurality of samples when the present state indicates the clock transition and the second and third down-sampled bits are equal and differ from the first down sampled bit and the third sample. A fourth down-sampled bit is generated that equals the third sample when the detection signal indicates the presence of the short pulse, and equals the second sample when the detection signal does not indicate the presence.

It will be appreciated that other embodiments are set forth in the Detailed Description and Claims which follow.

BRIEF DESCRIPTION OF THE DRAWINGS

Various aspects and advantages of the disclosed embodiments will become apparent upon review of the following detailed description and upon reference to the drawings, in which:

FIGS. 5-1 through 5-3 together form a diagram of a table specifying counts for pre-decoding transition state.

DETAILED DESCRIPTION

Figure 1:
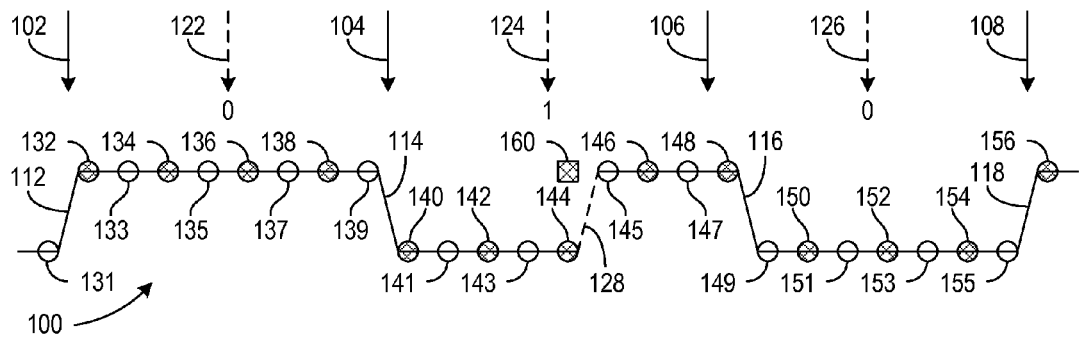
FIG. 1 is a timing diagram showing sampling of a differential Manchester waveform.

FIG. 1 is a timing diagram showing sampling of a differential Manchester waveform 100. Circles show the input samples taken from the differential Manchester waveform 100 of an input signal. One or more embodiments down-sample the input samples into down-sampled bits. The down-sampled bits are usually the even input samples, shown as crosshatched circles in FIG. 1. However, some embodiments create certain down-sampled bits to assist subsequent demodulation of data encoded within the differential Manchester waveform 100.

The differential Manchester waveform 100 has nominal positions 102, 104, 106, and 108 for clock transitions. The differential Manchester waveform 100 includes a clock transition for every nominal position 102, 104, 106, or 108. The differential Manchester waveform 100 includes a rising clock transition 112 for nominal position 102, a falling clock transition 114 for nominal position 104, a falling clock transition 116 for nominal position 106, and a rising clock transition 118 for nominal position 108. While the clock transitions 112, 114, and 118 occur at their nominal positions 102, 104, and 108, the clock transition 116 is delayed from its nominal position 106. For example, noise on the differential Manchester waveform 100 could delay clock transition 116 from its nominal position 106.

Interleaved between the nominal positions 102, 104, 106, and 108 for clock transitions, the differential Manchester waveform 100 has nominal positions 122, 124, and 126 for optional data transitions. A data transition present in a nominal position 122, 124, or 126 encodes a bit value of one, and a data transition absent from a nominal position 122, 124, or 126 encodes a bit value of zero. To encode a bit value of zero, differential Manchester waveform 100 has no data transition at nominal position 122. To encode a subsequent bit value of one, differential Manchester waveform 100 has data transition 128 at nominal position 124. To encode another bit value of zero, differential Manchester waveform 100 has no data transition at nominal position 126. The data transition 128 is delayed from its nominal position 124 by noise, for example.

Data demodulation can use the duration of the pulses between the transitions 112, 114, 128, 116, and 118 to distinguish data transition 128 from clock transitions 112, 114, 116, and 118. Transition 114 is a clock transition because a pulse with a long duration separates the preceding transition 112 from transition 114. Because transition 114 is a clock transition and a pulse with a short duration separates transitions 114 and 128, transition 128 is a data transition and the next transition 116 is a clock transition. Because a pulse with a long duration separates transitions 116 and 118, transition 118 is a clock transition. The number of constant-valued samples between adjacent transitions indicates the duration of the intervening pulse at a resolution dependent on the sampling rate.

The samples 131 through 156 oversample the differential Manchester waveform 100 by a factor of eight because there are eight samples for each adjacent pair of the nominal clock positions 102, 104, 106, and 108. The samples 131 through 156 include odd samples 131, 133, 135, 137, 139, 141, 143, 145, 147, 149, 151, 153, and 155, and even samples 132, 134, 136, 138, 140, 142, 144, 146, 148, 150, 152, 154, and 156.

The even samples (or the odd samples) could be used to oversample the differential Manchester waveform 100 by a factor of four. However, the even samples do not generally provide sufficient information to readily demodulate the data encoded within a differential Manchester waveform 100 affected by noise and jitter. For example, because data transition 128 is delayed by noise and/or jitter, there are three even samples 140, 142, and 144 in the short pulse between transitions 114 and 128, and because clock transition 116 is delayed by noise and/or jitter, there are three even samples 150, 152, and 154 in the long pulse between transitions 116 and 118. Thus, the number of even samples in the short pulse between transitions 114 and 128 equals the number of even samples in the long pulse between transitions 116 and 118. Therefore, the number of constant-valued even samples between two transitions does not provide sufficient information for distinguishing a short pulse from a long pulse.

In one embodiment, a short pulse encodes a bit value of one, and the short pulse starts after a clock transition, includes from three to six samples, and ends before a data transition. A long pulse encodes a bit value of zero, and the long pulse starts after a clock transition, includes from six to ten of the samples, and ends before another clock transition.

In one embodiment, the down-sampled bits correspond to an oversampling of the differential Manchester waveform 100 by a factor of four, and the down-sampled bits repeat the even samples 132, 134, 136, 138, 140, 142, 146, 148, 150, 152, 154, and 156, but omit the even sample 144. A down-sampled bit 160 is created to replace the even sample 144.

With this replacement, the short pulse between transitions 114 and 128 includes two down-sampled bits corresponding to even samples 140 and 142. This assists subsequent demodulation of data encoded within the differential Manchester waveform 100, because short pulses of two down-sampled bits are readily distinguishable from long pulses of three or more down-sampled bits.

Figure 2:
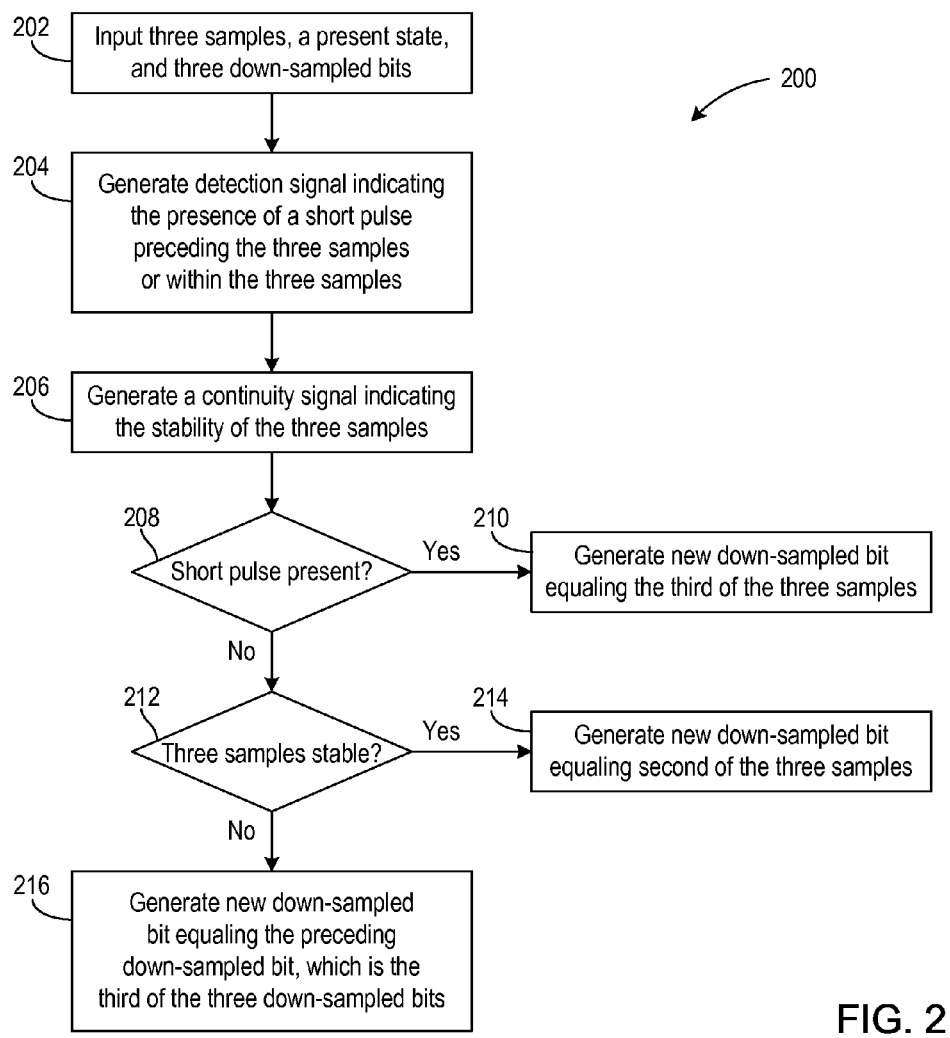
FIG. 2 is a flow diagram of a process for down-sampling the samples from a differential Manchester encoding.

FIG. 2 is a flow diagram of a process 200 for down-sampling the samples from a differential Manchester encoding. In one embodiment, samples oversample the differential Manchester encoding by a factor of eight and a decoder circuit generates down-sampled bits corresponding to an oversampling of the differential Manchester encoding by a factor of four.

At block 202, three samples, three down-sampled bits, and a present state are input. In an illustrative example from FIG. 1 for one embodiment, the three samples are the first, second, and third successive samples 143, 144, and 145, the three down-sampled bits are first, second, and third successive down-sampled bits that correspond to samples 138, 140, and 142, and the present state indicates the transition preceding the input samples 143, 144, and 145 is a clock transition 114 (and not a data transition).

At block 204, a detection signal is generated that indicates the presence of a short pulse within the samples when the present state indicates a clock transition and the second and third down-sampled bits are equal and both differ from both the first down-sampled bit and the third sample. In the illustrative example from FIG. 1 for one embodiment, the detection signal indicates a short pulse when the present state indicates clock transition 114, and the second and third down-sampled bits corresponding to samples 140 and 142 are equal with a low value that differs from the high value of the first down-sampled bit corresponding to sample 138 and from the high value of the third sample 145.

At block 206, a continuity signal is generated that indicates stability of the first, second, and third samples when the second sample is equal to either the first sample or the third sample. In the illustrative example from FIG. 1 for one embodiment, the continuity signal indicates the input samples 143, 144, and 145 are stable, because the second sample 144 equals the first sample 143. The continuity signal does not indicate stability when the three input samples have a glitch with the second sample differing from both the first and third samples.

Decision block 208 checks whether the detection signal indicates the presence of a short pulse. If a short pulse is detected, process 200 proceeds to block 210; otherwise, process 200 proceeds to decision block 212. At block 210, a fourth down-sampled bit is generated that equals the third sample. In the illustrative example from FIG. 1 for one embodiment, a new down-sampled bit 160 is generated that equals the third sample 145. While the down-sampled bits usually correspond to the even samples, new down-sampled bit 160 substitutes for even sample 144. This shortens the number of down-sampled bits for the detected short pulse to the two down-sampled bits corresponding to samples 140 and 142.

Decision block 212 checks whether the continuity signal indicates stability of the input samples. If the input samples are stable, process 200 proceeds to block 214; otherwise, process 200 proceeds to decision block 216. At block 214, a fourth down-sampled bit is generated that equals the second of the three input samples. This gives the default case that each down-sampled bit usually equals a corresponding even sample, because the second sample is an even sample in one embodiment. At block 216, to suppress a glitch in the samples, a fourth down-sampled bit is generated that equals the third of the three original down-sampled bits.

After generating the fourth down-sampled bit at block 210, 214, or 216, the fourth down-sampled bit is used to recursively generate the next down-sampled bit in one embodiment. This recursion can be temporal recursion and/or structural recursion. In the illustrative example from FIG. 1 for one embodiment, the new down-sampled bit 160 and previously generated down-sampled bits corresponding to samples 140 and 142 generate the next down-sampled bit corresponding to sample 146 from a potentially updated present state and samples 145, 146, and 147. Note that this recursion uses odd sample 145 to generate both down-sampled bit 160 and the next down-sampled bit corresponding to sample 146.

Figure 3:
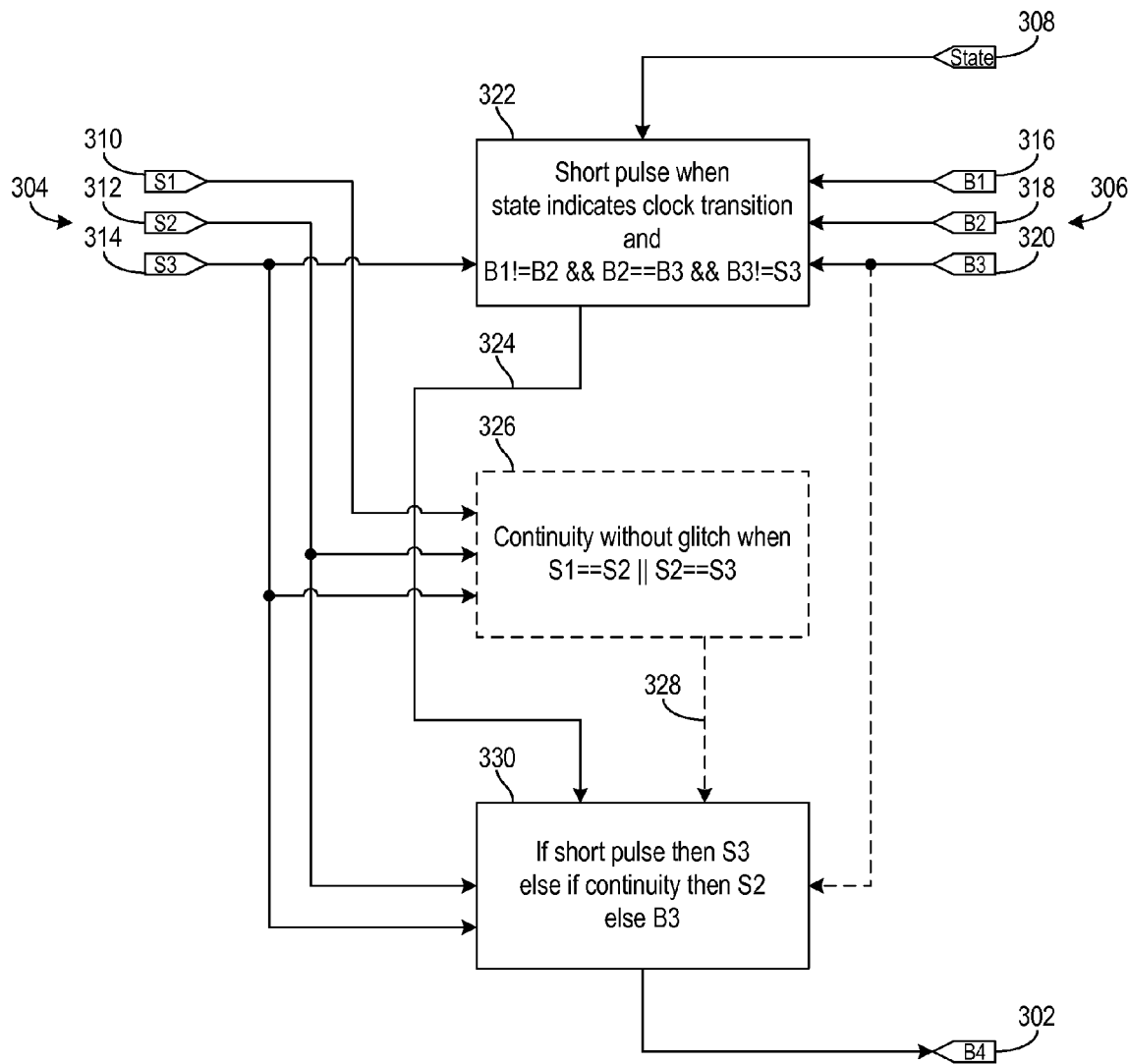
FIG. 3 is a block diagram of a decoder circuit for down-sampling the samples from a differential Manchester encoding.

FIG. 3 is a block diagram of a decoder circuit for down-sampling the samples from a differential Manchester encoding. The samples are oversamples of an input signal having the differential Manchester encoding. The decoder circuit generates a down-sampled bit at output pin 302 from the three samples received at input port 304, the three down-sampled bits received at input port 306, and the state received at input pin 308.

Input port 304 is arranged to receive a first sample S1 at input pin 310, a second sample S2 at input pin 312, and third sample S3 at input pin 314. In one embodiment, the first sample at input pin 310 is an odd sample, the second sample at input pin 312 is the next sample that is an even sample, and the third sample at input pin 314 is the next successive sample that is an odd sample. In one embodiment, the samples received at input port 304 are an oversampling of the input signal by a factor of eight, and the down-sampled bits received at input port 306 and generated at output pin 302 correspond to an oversampling of the input signal by a factor of four.

Input port 306 is arranged to receive a first down-sampled bit B1 at input pin 316, a second down-sampled bit B2 at input pin 318, and a third down-sampled bit B3 at input pin 320. These three down-sampled bits received at input port 306 are generated from samples including and preceding the sample received at input pin 310.

The input port of input pin 308 is arranged to receive a state signal ("state") indicating whether a clock transition or a data transition precedes the three samples received at input port 304.

In one embodiment, the input ports 304 and 306 and the input port of state pin 308 are arranged to receive, in parallel, the three samples at pins 310, 312, and 314, the three down-sampled bits at pins 316, 318, and 320, and the state at pin 308.

Detector circuit 322 is coupled to the input ports 304 and 306 and the input port of state pin 308. Detector circuit 322 is configured to generate a detection signal on line 324 that indicates the presence of a short pulse within the received samples when the state at pin 308 indicates a clock transition, and the second and third down-sampled bits at pins 318 and 320 are equal and differ from the first down-sampled bit at pin 316 and the third sample at pin 314. In one embodiment, detector circuit 322 is configured to generate the detection signal on line 324 that indicates the presence of the short pulse when the state at pin 308 indicates a clock transition, the first down-sampled bit at pin 316 does not equal the second down-sampled bit at pin 318, the second down-sampled bit equals the third down-sampled bit at pin 320, and the third down-sampled bit does not equal the third sample at pin 314.

In one embodiment, the detector circuit 322 is configured to detect the short pulse that starts after a clock transition, includes from three to six samples, and ends before a data transition with one of the second sample at pin 312, the first sample at pin 310, or a sample preceding the first sample at pin 310. When a short pulse is detected, the down-sampled bits corresponding to the short pulse are the second and third down-sampled bits at pins 318 and 320. In this embodiment, a long pulse within the samples starts after a clock transition, includes from six to ten of the samples, and ends before another clock transition.

Optional continuity circuit 326 is configured to generate a continuity signal on line 328 that indicates stability of the samples received at input port 304 when the second sample at pin 312 is equal to either the first sample at pin 310 or the third sample at pin 314.

Generator circuit 330 is coupled to the detector circuit 322 and the input port 304. The generator circuit 330 is configured to generate a down-sampled bit B4 at output pin 302. This down-sampled bit equals the third sample at pin 314 when the detection signal on line 324 indicates the presence of a short pulse. In one embodiment, omitting the optional continuity circuit 326, this down-sampled bit equals the second sample at pin 312 when the detection signal on line 324 does not indicate the presence of a short pulse. In an embodiment including the optional continuity circuit 326, the down-sampled bit at output pin 302 equals the second sample at pin 312 when the detection signal on line 324 does not indicate presence of a short pulse and the continuity signal on line 328 indicates stability, and this down-sampled bit equals the third down-sampled bit at pin 320 when the detection signal on line 324 does not indicate presence of a short pulse and the continuity signal on line 328 does not indicate stability.

Figure 4:
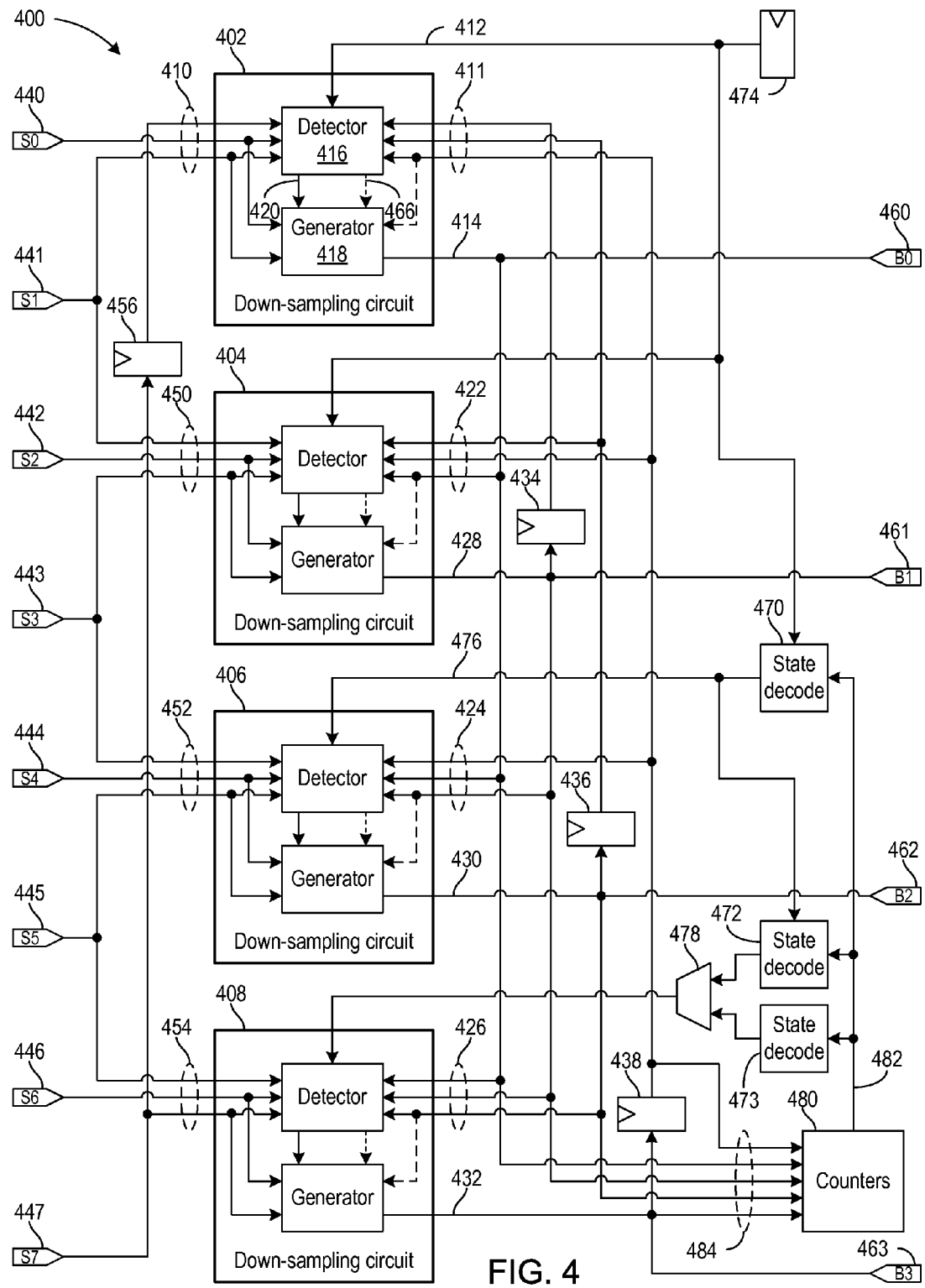
FIG. 4 is a block diagram of a decoder circuit having multiple instances of a down-sampling circuit.

FIG. 4 is a block diagram of a decoder circuit 400 having multiple instances 402, 404, 406, and 408 of a down-sampling circuit. These multiple instances 402, 404, 406, and 408 of the down-sampling circuit implement structural recursion of the down-sampling circuit. Down-sampling circuits 402, 404, 406, and 408 can be implemented as shown in FIG. 3, for example.

Each of the instances 402, 404, 406, and 408 of the down-sampling circuit includes an input port, an output port, a detector circuit, and a generator circuit. For example, instance 402 includes an input port on lines 410, 411, and 412, an output port on line 414, a detector circuit 416, and a generator circuit 418.

Lines 410 of the input port are arranged to receive initial, middle, and final samples. Lines 411 of the input port are arranged to receive initial, middle, and final down-sampled bits from the respective down-sampled bit generated at the output port of the other instances 404, 406, and 408 of the down-sampling circuit. Line 412 of the input port is arranged to receive a state.

The output port on line 414 is arranged to transmit a respective down-sampled bit from the instance 402.

The detector circuit 416 is coupled to the input port on lines 410, 411, and 412. The detector circuit 416 is configured to generate a detection signal on line 420 indicating a presence of a short pulse that ends before or within the three samples of lines 410. The detection signal on line 420 is generated from the three samples on lines 410, the three down-sampled bits on lines 411, and the state on line 412. In one embodiment, the detection signal on line 420 indicates the presence of a short pulse when the state on line 412 indicates a clock transition and not a data transition, the initial down-sampled bit does not equal the middle down-sampled bit, the middle down-sampled bit equals the final down-sampled bit, and the final down-sampled bit does not equal the third sample.

The generator circuit 418 is coupled to the detector circuit 416 and lines 410, 411, and 414 of the input and output ports.

The generator circuit 418 is configured to generate the respective down-sampled bit on line 414 for instance 402. The respective down-sampled bit on line 414 equals the final sample when the detection signal on line 420 indicates the presence of a short pulse, and the respective down-sampled bit equals the middle sample when the detection signal does not indicate the presence of a short pulse.

The down-sampled bits generated at the output ports on lines 414, 428, 430, and 432 have structural and/or temporal recursion to the input ports of instances 402, 404, 406, and 408. For example, the down-sampled bit from the output port on line 428 of instance 404 has structural recursion to instance 406 to generate a first successive down-sampled bit, structural recursion to instance 408 to generate a second successive down-sampled bit, and structural and temporal recursion to instance 402 to generate a third successive down-sampled bit in the next clock cycle.

To achieve the structural recursion from instance 402 to instances 404, 406, and 408, the respective down-sampled bit from the output port on line 414 of instance 402 is coupled to the final down-sampled bit of lines 422 of the input port of instance 404, the middle down-sampled bit of lines 424 of the input port of instance 406, and the initial down-sampled bit of lines 426 of the input port of instance 408. Similarly, the respective down-sampled bit from the output port on line 428 of instance 404 is coupled to the final down-sampled bit of lines 424 the input port of instance 406 and the middle down-sampled bit of lines 426 of the input port of instance 408. In addition, the respective down-sampled bit from the output port on line 430 of instance 406 is coupled to the final down-sampled bit of lines 426 of the input port of instance 408.

To achieve structural and temporal recursion from instance 404 to instance 402, the respective down-sampled bit from the output port on line 428 of instance 404 is coupled to an input signal of register 434, and an output signal of register 434 is coupled to the initial down-sampled bit of lines 411 of the input port of the instance 402. Similarly, the respective down-sampled bit from the output port on line 430 of instance 406 is coupled to an input signal of register 436, and an output signal of register 436 is coupled to the middle down-sampled bit of lines 411 of the input port of instance 402 and to the initial down-sampled bit of lines 422 of the input port of instance 404. In addition, the respective down-sampled bit from the output port on line 432 of instance 408 is coupled to an input signal of register 438, and an output signal of register 438 is coupled to the final down-sampled bit of lines 411 of the input port of instance 402, the middle down-sampled bit of lines 422 of the input port of instance 404, and the initial down-sampled bit of lines 424 of the input port of instance 406.

The decoder circuit 400 receives eight input samples S0-S7 in parallel at input pins 440 through 447. The even input samples received at pins 440, 442, 444, and 446 are the middle sample of respective lines 410, 450, 452, and 454 of the input ports of respective instances 402, 404, 406, and 408. The odd samples received at pins 441, 443, 445, and 447 are shared between respective pairs of cyclically adjacent instances. The odd input sample received at pin 441 is both the final sample of lines 410 of the input port of instance 402 and the initial sample of lines 450 of the input port of instance 404. The odd input sample received at pin 443 is both the final sample of lines 450 of the input port of instance 404 and the initial sample of lines 452 of the input port of instance 406. The odd input sample received at pin 445 is both the final sample of lines 452 of the input port of instance 406 and the initial sample of lines 454 of the input port of instance 408. In addition, the odd input sample received at pin 447 is both the final sample of lines 454 of the input port of instance 408 and, in the next clock cycle through register 456, the initial sample of lines 410 of the input port of instance 402.

The decoder circuit 400 generates four down-sampled bits B0-B3 in parallel at output pins 460, 461, 462, and 463 that are the down-sampled bits generated at the output ports on lines 414, 428, 430, and 432 from instances 402, 404, 406, and 408. Each clock cycle, the four down-sampled bits generated at pins 460, 461, 462, and 463 are a down-sampling by a factor of two of the eight input samples received at pins 440 through 447. This down-sampling of decoder circuit 400 assists subsequent demodulation of the data encoded within the differential Manchester waveform because short pulses are readily distinguishable from long pulses in the down-sampled bits generated at output pins 460, 461, 462, and 463.

In one embodiment, the detector circuit of each instance 402, 404, 406, or 408 is further configured to generate a continuity signal indicating a stability of its input samples. For example, detector circuit 416 of instance 402 is configured to generate the continuity signal on line 466 that indicates stability of the initial, middle, and final samples on lines 410 when the middle sample is equal to either the initial sample or the final sample. The generator circuit 418 is configured to generate the respective down-sampled bit on line 414 that equals one of the final sample, the middle sample, or the final down-sampled bit. The respective down-sampled bit on line 414 equals the final sample when the detection signal on line 420 indicates the presence of a short pulse. The respective down-sampled bit on line 414 equals the middle sample when the detection signal on line 420 does not indicate the presence and the continuity signal on line 466 indicates stability. The respective down-sampled bit on line 414 equals the final down-sampled bit when the detection signal on line 420 does not indicate the presence and the continuity signal on line 466 does not indicate stability.

In one embodiment, instances 402, 404, 406, and 408 are associated with respective pre-decoder circuits 470, 472, and 473, and state register 474. For example, pre-decoder circuit 470 is coupled to line 476 of the input port of instance 406. Pre-decoder circuit 470 is configured to generate a state indicating whether a clock transition or a data transition precedes the initial, middle, and final samples on lines 452.

FIGS. 5-1 through 5-3 together form a diagram of a table specifying counts for pre-decoding transition state. Counter circuit 480 of FIG. 4 generates counts on line 482 according to the table of FIG. 5.

Columns 502, 504, 506, 508, and 510 correspond to respective lines 484 input into counter circuit 480 of FIG. 4. Column 502 corresponds to the output signal of register 438, column 504 corresponds to the down-sampled bit on line 414, column 506 corresponds to the down-sampled bit on line 428, column 508 corresponds to the down-sampled bit on line 430, and column 510 corresponds to the down-sampled bit on line 432.

Column 512 shows the values of the counts. Rows 514 specify the number of transitions within various possible values of the five down-sampled bits in columns 502, 504, 506, 508, and 510. Rows 516 specify a count of the number of unchanged bits in the pulse at the end of various values of the five down-sampled bits in columns 502, 504, 506, 508, and 510. Rows 518 specifies a count of the number of unchanged bits in the pulse preceding the last transition at the end of various values of the five down-sampled bits in columns 502, 504, 506, 508, and 510. Rows 520 specify an increment for the width of the first pulse at the beginning of various values of the five down-sampled bits in columns 502, 504, 506, 508, and 510. The total width of this first pulse is the sum of the incremental width from rows 520 and the value from rows 516 for the prior clock cycle. Rows 522 specify a width of the second pulse from the beginning of various values of the five down-sampled bits in columns 502, 504, 506, 508, and 510. Rows 524 specify a width of the third pulse from the beginning of various values of the five down-sampled bits in columns 502, 504, 506, 508, and 510.

State register 474 stores the state pre-decoded in the prior clock cycle. This state indicates whether a clock or a data transition precedes the samples at input pins 440 through 447. Instances 402 and 404 directly receive the state from register 474. Instance 406 receives the state from register 474 as updated by state pre-decoder circuit 470. Instance 408 receives the state from register 474 as either updated by state pre-decoder circuit 473 or successively updated by state pre-decoder circuits 470 and 472 (for clarity, a connection from register 474 to state pre-decoder circuit 473 is omitted from FIG. 4).

Pre-decoder circuit 470 of FIG. 4 indicates a data transition when the count of unchanged bits shown in column 512 of rows 516 is one or two unchanged bits, and the sum of the two counts of unchanged bits in rows 516 and 518 is more than five unchanged bits. Pre-decoder circuit 470 indicates a clock transition when the number of unchanged bits shown in column 512 of rows 516 is three, four, or five unchanged bits.

Multiplexer 478 is controlled by the number of transitions given in column 512 of rows 514. If there is one transition, multiplexer 478 passes the state from pre-decoder circuit 473, and otherwise multiplexer 478 passes the state from pre-decoder circuit 472.

When the first transition is between the down-sampled bits at output pins 460 and 461, pre-decoder circuit 473 updates the state after this transition. Pre-decoder circuit 473 determines this updated state from the prior state in register 474 and the various counts provided by counter circuit 480 according to the table of FIG. 5.

Pre-decoder circuit 472 updates the state after two transitions in the down-sampled bits at output pins 460 and 461. Pre-decoder circuit 472 determines this updated state from the state output of pre-decoder circuit 470 and the various counts provided by counter circuit 480 according to the table of FIG. 5.

The embodiments are thought to be applicable to a variety of systems for down-sampling an oversampling of a differential Manchester encoding. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A decoder circuit for down-sampling a plurality of samples from an input signal having a differential Manchester encoding, comprising:
    a first input port arranged to receive a first, a second, and a third sample of the plurality of samples, the plurality of samples being oversamples of the input signal;
    a second input port arranged to receive a state indicating whether a clock transition or a data transition precedes the first, second, and third samples;
    a third input port arranged to receive a first, a second, and a third down-sampled bit generated from the plurality of samples;
    a detector circuit coupled to the first, second, and third input ports and configured to generate a detection signal indicating a presence of a short pulse within the plurality of samples in response to the state indicating the clock transition and the second and third down-sampled bits being equal and differing from the first down-sampled bit and the third sample; and
    a generator circuit coupled to the detector circuit and the first input port, the generator circuit configured to generate a fourth down-sampled bit, wherein the fourth down-sampled bit equals the third sample in response to the detection signal indicating the presence of the short pulse, and the fourth down-sampled bit equals the second sample in response to the detection signal not indicating the presence.

2. The decoder circuit of claim 1, wherein the first, second, and third input ports are arranged to receive, in parallel, the first, second, and third samples, the state, and the first, second, and third down-sampled bits.

3. The decoder circuit of claim 1, wherein the plurality of samples are an oversampling of the input signal by a factor of eight, and the first, second, third, and fourth down-sampled bits correspond to an oversampling of the input signal by a factor of four.

4. The decoder circuit of claim 3, wherein:
    the detector circuit is configured to detect the short pulse that starts after the clock transition, and the short pulse includes from three to six of the plurality of samples and ends before the data transition with one of the second sample, the first sample, or one of the plurality of samples preceding the first sample; and
    the down-sampled bits corresponding to the short pulse are the second and third down-sampled bits.

5. The decoder circuit of claim 4, wherein:
    a long pulse within the plurality of samples starts after a clock transition, includes from six to ten of the plurality of samples, and ends before another clock transition; and
    from three to five down-sampled bits correspond to the long pulse.

6. The decoder circuit of claim 1, wherein the detector circuit is configured to generate the detection signal indicating the presence of the short pulse in response to the state indicating the clock transition, the first down-sampled bit not equaling the second down-sampled bit, the second down-sampled bit equaling the third down-sampled bit, and the third down-sampled bit not equaling the third sample.

7. The decoder circuit of claim 1, further comprising a continuity circuit coupled to the first input port and the generator circuit, the continuity circuit being configured to generate a continuity signal indicating a stability of the first, second, and third samples in response to the second sample being equal to either the first sample or the third sample.

8. The decoder circuit of claim 7, wherein the generator circuit is configured to generate the fourth down-sampled bit that equals:
    the third sample in response to the detection signal indicating the presence of the short pulse within the plurality of samples;
    the second sample in response to the detection signal not indicating the presence and the continuity signal indicating the stability; and
    the third down-sampled bit in response to the detection signal not indicating the presence and the continuity signal not indicating the stability.

9. The decoder circuit of claim 1, further comprising a pre-decoder circuit coupled to the second input port and configured to generate the state indicating whether a clock transition or a data transition precedes the first, second, and third samples.

10. The decoder circuit of claim 1, wherein:
the detector circuit and the generator circuit are included in a first instance of a down-sampling circuit;
the decoder circuit includes a second, a third, and a fourth instance of the down-sampling circuit;
the fourth down-sampled bit from the first instance is coupled to the third down-sampled bit of the third input port of the second instance, the second down-sampled bit of the third input port of the third instance, and the first down-sampled bit of the third input port of the fourth instance;
the fourth down-sampled bit from the second instance is coupled to the third down-sampled bit of the third input port of the third instance and the second down-sampled bit of the third input port of the fourth instance;
the fourth down-sampled bit from the third instance is coupled to the third down-sampled bit of the third input port of the fourth instance;
the third sample of the first input port of the first instance is the first sample of the first input port of the second instance;
the third sample of the first input port of the second instance is the first sample of the first input port of the third instance; and
the third sample of the first input port of the third instance is the first sample of the first input port of the fourth instance.

11. A decoder circuit for down-sampling a plurality of samples from an input signal having a differential Manchester encoding, comprising:
a first, a second, a third, and a fourth instance of a down-sampling circuit, each instance of the down-sampling circuit including:
an output port arranged to transmit a respective down-sampled bit from the instance of the down-sampling circuit;
an input port arranged to receive a state, three samples of the plurality samples, and three down-sampled bits from the respective down-sampled bit of the output port of each other instance of the down-sampling circuit, wherein the three samples include an initial, a middle, and a final sample;
a detector circuit coupled to the input port and configured to generate a detection signal indicating a presence of a short pulse that ends before or within the three samples, wherein the detection signal is generated from the state, the three samples, and the three down-sampled bits; and
a generator circuit coupled to the detector circuit and the input and output ports, the generator circuit being configured to generate the respective down-sampled bit of the instance, wherein the respective down-sampled bit equals the final sample in response to the detection signal indicating the presence of the short pulse, and the respective down-sampled bit equals the middle sample in response to the detection signal not indicating the presence.

12. The decoder circuit of claim 11, wherein:
the three down-sampled bits of the input port of each instance of the down-sampling circuit include an initial, a middle, and a final down-sampled bit;
the respective down-sampled bit from the output port of the first instance is coupled to the final down-sampled bit of the input port of the second instance, the middle down-sampled bit of the input port of the third instance, and the initial down-sampled bit of the input port of the fourth instance;
the respective down-sampled bit from the output port of the second instance is coupled to the final down-sampled bit of the input port of the third instance and the middle down-sampled bit of the input port of the fourth instance; and
the respective down-sampled bit from the output port of the third instance is coupled to the final down-sampled bit of the input port of the fourth instance.

13. The decoder circuit of claim 12, wherein:
the respective down-sampled bit from the output port of the second instance is coupled to an input signal of a first register, and an output signal of the first register is coupled to the initial down-sampled bit of the input port of the first instance;
the respective down-sampled bit from the output port of the third instance is coupled to an input signal of a second register, and an output signal of the second register is coupled to the middle down-sampled bit of the input port of the first instance and the initial down-sampled bit of the input port of the second instance; and
the respective down-sampled bit from the output port of the fourth instance is coupled to an input signal of a third register, and an output signal of the third register is coupled to the final down-sampled bit of the input port of the first instance, the middle down-sampled bit of the input port of the second instance, and the initial down-sampled bit of the input port of the third instance.

14. The decoder circuit of claim 13, wherein:
the final sample of the input port of the first instance is the initial sample of the input port of the second instance;
the final sample of the input port of the second instance is the initial sample of the input port of the third instance; and
the final sample of the input port of the third instance is the initial sample of the input port of the fourth instance.

15. The decoder circuit of claim 11, wherein:
the three down-sampled bits of the input port of each instance of the down-sampling circuit include an initial, a middle, and a final down-sampled bit; and
the detector circuit of each instance of the down-sampling circuit is configured to generate the detection signal indicating the presence of the short pulse in response to the state indicating a clock transition and not a data transition, the initial down-sampled bit not equaling the middle down-sampled bit, the middle down-sampled bit equaling the final down-sampled bit, and the final down-sampled bit not equaling the third sample.

16. The decoder circuit of claim 11, wherein:
the detector circuit of each instance of the down-sampling circuit is further configured to generate a continuity signal indicating a stability of the initial, middle, and final samples of the input port of the instance in response to the middle sample being equal to either the initial sample or the final sample; and
the generator circuit of each instance of the down-sampling circuit is configured to generate the respective down-sampled bit that equals:
the final sample in response to the detection signal indicating the presence of the short pulse within the plurality of samples;
the middle sample in response to the detection signal not indicating the presence and the continuity signal indicating the stability; and the final down-sampled bit in response to the detection signal not indicating the presence and the continuity signal not indicating the stability.

17. The decoder circuit of claim 11, wherein:
at least one instance of the first, second, third, and fourth instances of the down-sampling circuit is associated with a pre-decoder circuit; and
the pre-decoder circuit is coupled to the input port of the instance and configured to generate the state indicating whether a clock transition or a data transition precedes the initial, middle, and final samples.

18. A method for down-sampling a plurality of samples from an input signal having a differential Manchester encoding, comprising:
inputting to a decoder circuit, three samples of the plurality of samples that are oversamples of the input signal, a present state indicating whether a clock transition or a data transition precedes the three samples, and three down-sampled bits generated from the plurality of samples;
wherein the three samples include a first, a second, and a third sample, and the three down-sampled bits include a first, a second, and a third down-sampled bit;
generating a detection signal indicating a presence of a short pulse within the plurality of samples in response to the present state indicating the clock transition and the second and third down-sampled bits being equal and differing from the first down-sampled bit and the third sample; and
generating a fourth down-sampled bit;
wherein the fourth down-sampled bit equals the third sample in response to the detection signal indicating the presence of the short pulse, and the fourth down-sampled bit equals the second sample in response to the detection signal not indicating the presence.

19. The method of claim 18, further comprising generating a continuity signal indicating a stability of the first, second, and third samples in response to the second sample being equal to either the first sample or the third sample.

20. The method of claim 19, wherein the generating of the fourth down-sampled bit includes generating the fourth down-sampled bit that equals:
the third sample in response to the detection signal indicating the presence of the short pulse within the plurality of samples;
the second sample in response to the detection signal not indicating the presence and the continuity signal indicating the stability; and
the third down-sampled bit in response to the detection signal not indicating the presence and the continuity signal not indicating the stability.

* * * * *